(12) United States Patent
Torrents Abad et al.

(10) Patent No.: US 10,326,040 B1
(45) Date of Patent: Jun. 18, 2019

(54) WASHABLE MOLD FOR CONFORMABLE LAYER FORMATION ON SEMICONDUCTOR DEVICES

(71) Applicant: Facebook Technologies, LLC, Menlo Park, CA (US)

(72) Inventors: Oscar Torrents Abad, Saarbrucken (DE); Tilman Zehender, Cork (IE); Pooya Saketi, Cork (IE); Karsten Moh, Saarbrucken (DE)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 15/903,016

(22) Filed: Feb. 22, 2018

(51) Int. Cl.
*H01L 27/12* (2006.01)
*H01L 27/15* (2006.01)
*H01L 31/18* (2006.01)
*H01L 33/30* (2010.01)
*H05K 13/04* (2006.01)
*H01L 21/673* (2006.01)
*H01L 21/683* (2006.01)
*H01L 21/782* (2006.01)

(52) U.S. Cl.
CPC ............ *H01L 31/18* (2013.01); *H01L 21/673* (2013.01); *H01L 21/683* (2013.01); *H01L 21/782* (2013.01); *H01L 27/1266* (2013.01); *H01L 27/156* (2013.01); *H01L 33/305* (2013.01); *H05K 13/0404* (2013.01)

(58) Field of Classification Search
CPC ............. H01L 21/6836; H01L 27/1266; H01L 25/0753
See application file for complete search history.

(56) References Cited

U.S. PATENT DOCUMENTS

2006/0270236 A1* 11/2006 Kusumoto .......... H01L 27/1266
438/692
2018/0068986 A1* 3/2018 Yoo ...................... H05K 999/99

\* cited by examiner

*Primary Examiner* — Farun Lu
(74) *Attorney, Agent, or Firm* — Fenwick & West LLP

(57) ABSTRACT

Embodiments relate to forming a conformable interface layers (clayers) on small semiconductor devices, such as light emitting diodes (LEDs) to facilitate adhesion with a pick-up head for operations during the manufacturing of an electronic display. A conformable material is formed in regions between LED dies on a carrier substrate and over the LED dies. A mask is applied over the conformable material to selectively cover the conformable material. Portions of the conformable material are exposed to light to selectively cure or not cure the portions of the conformable material. The conformable material between the LED dies is removed to form a conformable interface layer over each of the LED dies.

19 Claims, 11 Drawing Sheets

200

Form a conformable material in regions between light emitting diode (LED) dies on a carrier substrate and over the LED dies
202

Apply a mask over the conformable material to selectively cover the conformable material
206

Expose portions of the elastomeric material to light to cure or not cure portions of the conformable
208

Remove the conformable material between the LED dies to form a conformable interface layer (clayer) over each of the LED dies
210

FIG. 2

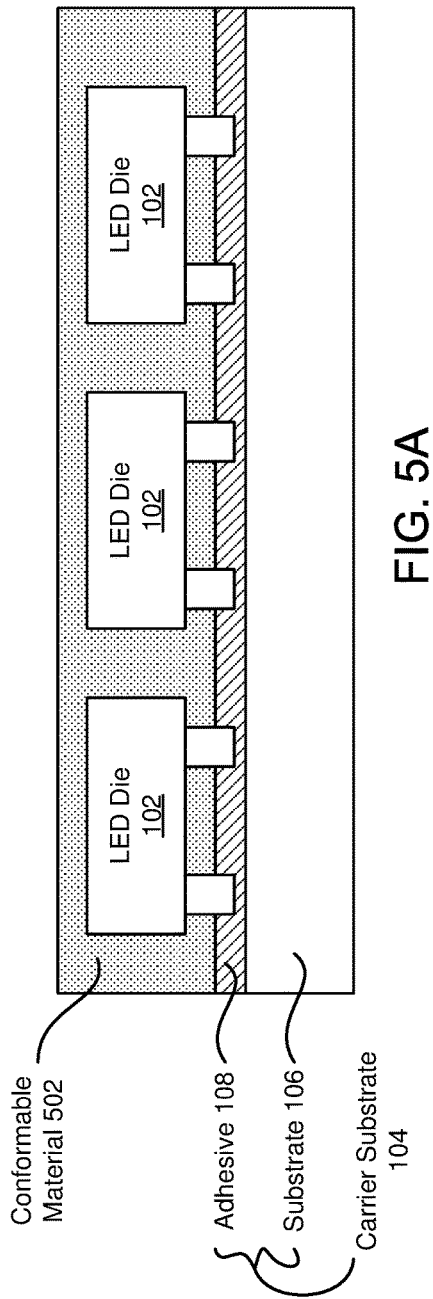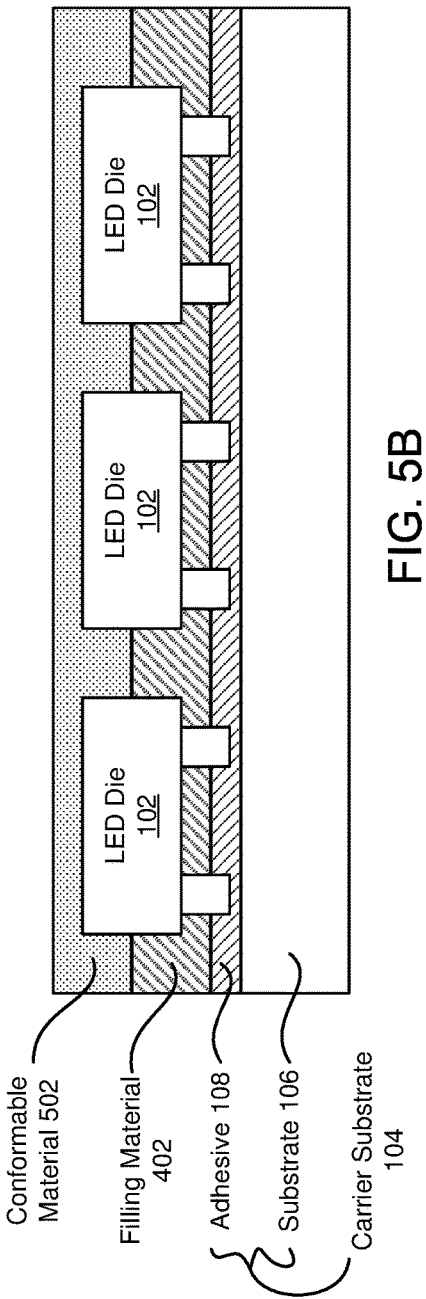

WASHABLE MOLD FOR CONFORMABLE LAYER FORMATION ON SEMICONDUCTOR DEVICES

BACKGROUND

The present disclosure relates to semiconductor device fabrication, specifically to placing a conformable material over light emitting diode (LED) dies to facilitate adhesive attachment in display fabrication.

In LED display fabrication, LEDs may be moved from one substrate to another. For example, micro-LEDs of different color may be transferred from carrier substrates to a display substrate including control circuits for the micro-LEDs to manufacture an electronic display. As the form factor of LED's decreases, the picking and placing of LEDs into desired arrangements and without damaging the LED dies becomes increasingly difficult.

SUMMARY

Embodiments relate to forming a conformable interface layer on semiconductor devices to facilitate adhesion with a pick-up head for pick and place operations during the manufacturing of an electronic display.

In one or more embodiments, a conformable material is formed at side surfaces and over a light emitting surface of a light emitting diode (LED) die on a carrier substrate. A mask is applied over the conformable material to selectively cover the conformable material. Portions of the conformable material are exposed to light to selectively cure the portions of the conformable material over the light emitting surface of the LED die. When the conformable material includes positive photosensitive material, portions over the light emitting surface that are not exposed to light are cured. When the conformable material includes negative photosensitive material, portions over the light emitting surface that are exposed to light are cured. The conformable material at the side surfaces that is not cured after exposing the portions of the conformable material to light is removed to form a conformable interface layer over the light emitting surface of the LED die from the conformable material over the LED die.

In some embodiments, prior to forming the conformable material at the side surfaces and over the light emitting surface of the LED die, a filling material is formed at the side surfaces of the LED die. The conformable material is then formed over the filling material at the side surfaces and over the LED die. Subsequent to removing the conformable material at the side surfaces, the filling material at the side surfaces of the LED die is removed.

In some embodiments, the conformable material includes positive photosensitive material. The portions of the conformable material exposed to the light includes conformable material at the side surfaces of the LED die such that the light does not cure the conformable material at the side surfaces of the LED die. Here, the conformable material over the LED die that is not exposed to light is cured.

In some embodiments, the conformable material includes negative photosensitive material. The portion of the conformable material exposed to the light includes the conformable material over the LED die such that the light cures the conformable material over the LED die.

In some embodiments, LED die on the carrier substrate is picked up by attaching a non-conformable pick-up head to the conformable interface layer over the light emitting surface of the LED die. The LED die attached to the non-conformable pick-up head is placed on a display substrate defining pixel control circuits of an electronic display.

In some embodiments, the applied light includes ultraviolet wavelengths. In some embodiments, the LED die is a micro-LED and includes Gallium nitride (GaN), gallium arsenide (GaAs), or gallium phosphide (GaP).

In some embodiments, a plurality of LED dies are present on the carrier substrate, the conformable material is formed in regions between the LED dies and over the LED dies, the mask is applied over the plurality of LED dies, and the conformable material between the LED dies is removed to form a conformable interface layer over each of the LED dies from the conformable material over the LED dies.

In some embodiments, the LED dies are fabricated on a native substrate. A carrier film capable of expanding is attached to a first side of the LED dies on the native substrate. The native substrate is detached from the LED dies. The LED dies attached to the carrier film are singulated. The LED dies are separated by expanding the carrier film to define the regions between the LED dies. The carrier substrate is applied to a second side of the LED dies, the carrier substrate including a glass substrate layer and an adhesive layer. The LED dies are attached to the adhesive layer of the carrier substrate with the regions being defined between the LED dies. The carrier film is separated from the first side of the LED dies to expose the first side of the LED dies to the forming of the elastomeric material.

In some embodiments, an electronic display panel is fabricated by forming a conformable material in regions between LED dies on a carrier substrate and over the LED dies. A mask is applied over the elastomeric material to selectively cover the conformable material. Portions of the conformable material are exposed to light to selectively cure or not cure the portions of the conformable material. The conformable material between the LED dies that is uncured after exposing the portions of the conformable material to light to form a conformable interface layer over each of the LED dies from the conformable material over the LED dies. At least a portion of the LED dies on the carrier substrate are picked up by attaching a pick-up head to the conformable interface layers over the LED dies. At least a portion of the LED dies attached to the pick-up head are placed on a display substrate defining pixel control circuits of an electronic display panel.

In some embodiments, a non-transitory computer readable medium storing instructions that when executed by a processor of a display manufacturing system configure the processor to perform tasks: a conformable material is formed at side surfaces and over a light emitting surface of an LED die on a carrier substrate. A mask is applied over the conformable material to selectively cover the conformable material. Portions of the conformable material are exposed to light to selectively cure or not cure the portions of the conformable material. The conformable material at the side surfaces that is uncured after exposing the portions of the conformable material to light are removed to form a conformable interface layer over the light emitting surface of the LED die from the conformable material over the LED die.

BRIEF DESCRIPTION OF DRAWINGS

Figure (FIG. 1 is a cross sectional view of LED dies on a carrier substrate with a conformable layer (clayer) over each LED die, according to one embodiment.

FIG. 2 is a flowchart of a method for forming a clayer over LED dies on the carrier substrate, according to one embodiment.

FIG. 5A is a cross sectional view of LED dies on the carrier substrate with conformable material in the regions between the LED dies and over the LED dies, according to one embodiment.

FIG. 5B is a cross sectional view of LED dies on the carrier substrate with a filling material in the regions between the LED dies and the conformable material in the regions and over the LED dies, according to one embodiment.

The figures depict various embodiments of the present disclosure for purposes of illustration only.

DETAILED DESCRIPTION

Embodiments relate to forming a conformable interface layer (clayer) over multiple light emitting diode (LED) dies by forming materials across multiple LED dies and removing the materials between the LED dies. The formed clayer allows each LED to be picked up by a pick and place head (PPH), and placed onto a display substrate including control circuits for sub-pixels of an electronic display. In some embodiments, the LED dies are micro-LED (µLED) dies.

Figure 1:
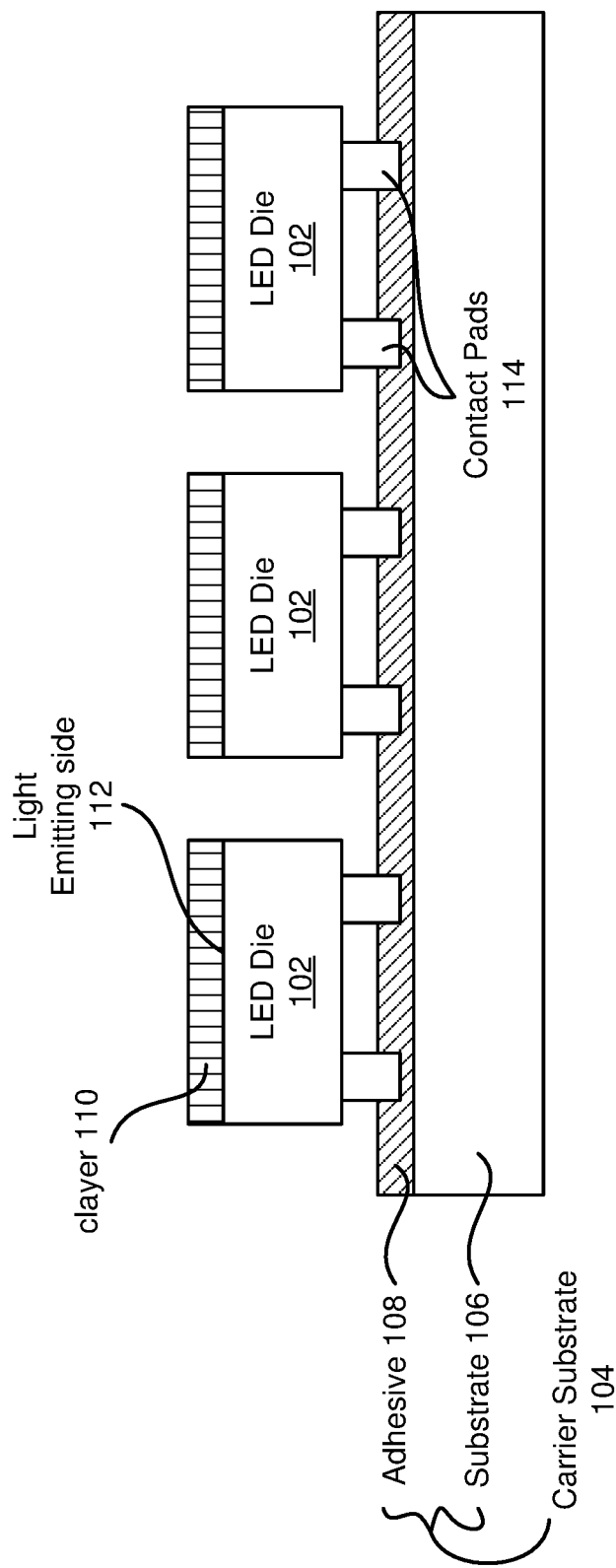

FIG. 1 is a cross sectional view of LED dies 102 on a carrier substrate 104 with a conformable interface layer (clayer) 110 over each LED die, according to one embodiment. The carrier substrate 104 may further include an adhesive layer 108 and substrate 106. The clayer 110 is formed on the light emitting side 112 of each LED die 102, and the other side of the LED dies 102 including contact pads 114 are attached to the substrate 106 by an adhesive 108. The clayer 110 is conformable layer that allows each of the LED dies 102 to be attached to and picked up by a pick-up surface of a pick and place head (PPH) (described with reference to FIG. 9). In particular, the clayer 110 facilitates attachment with non-conformable pick-up surfaces 904 of the PPH 902, or in another example, conformable pick-up surfaces 904 of a PPH 902. Although the pick and place tool discussed herein is a PPH 902, other types of pick-up heads using adhesive attachment with clayers 110 may be used. The clayer 110 may attach to a pick-up surface 904 due to adhesion forces, such as Van der Waals.

Each of the LED dies 102 emit light out of the light emitting side 112 if an electric potential is applied between electrical contact pads 114. The electrical contact pads 114 serve as interconnects for the LED dies 102 when the LED dies 102 are mounted to a display substrate 1002. The LED dies may be made of Gallium nitride (GaN), gallium arsenide (GaAs), or gallium phosphide (GaP), and in some embodiments, the LED dies are micro-LED (µLED) dies. In some embodiments, the discussion herein with respect to LED dies may be applicable to vertical-cavity surface-emitting lasers (VCSELs). For example, a clayer may be formed on a VCSEL to facilitate pick and place of the VCSEL.

The clayer 110 is formed on the light emitting side 112 of each LED die 102. The clayer 110 is a conformable layer that allows the LED dies 102 to be picked up by a pick-up surface 904 due to adhesion forces. The clayer 110 may be a polymer thermoset that was cured though light exposure. The clayer 110 can include any material that provides sufficient adhesion to the pick-up surfaces 904. For example, the clayer 110 includes elastomers, such as Polydimethylsiloxane (PDMS) or Polyurethane (PU). Elastomeric material may be a polymer with viscoelasticity (having both viscosity and elasticity). Elastomeric material may also have weak inter-molecular forces, a low Young's modulus, and/or high failure strain compared with other materials. In some embodiments, the clayer 110 contains no elastomeric materials. For example, the clayer 110 includes gels that provides adhesion via covalent chemical bonds.

The carrier substrate 104 has a flat surface mounted with LED dies 102 that supports the LED dies 102 during the process of forming the clayer 110 over each LED die 102. The carrier substrate 104 may have any number of LED dies 102 attached to it, such as one or more arrays of LED dies. The carrier substrate 104 may be a hard flat surface, rigid enough to support the LED dies 102 as the carrier substrate 104 is moved. In some embodiments, the carrier substrate 104 is mounted with other types of semiconductor devices, such as photodiodes or VCELs, to facilitate placement of the semiconductor devices. The carrier substrate 104 may include a substrate 106 and a layer of adhesive 108. The adhesive 108 attaches the LED dies 102 to the substrate 106. In some embodiments, the LED dies 102 are removed from the carrier substrate 104 by removing the adhesive 108 with a solvent. In other embodiments, the adhesive 108 is weak enough that the LED dies 102 may be removed with force (e.g., by a PPH 902) without damaging the LED dies 102. The substrate 104 may be a rigid surface. In some embodiments the substrate 106 is an electrical insulator, such as glass.

FIG. 2 is a flowchart of a method 200 for forming a clayer 110 over LED dies 102 on the carrier substrate 104, according to one embodiment. Among other advantages, the method 200 provides for simultaneous formation of a clayer 110 on multiple LED dies 102 without disturbing the positions of the LED dies 102 or damaging the LED dies 102 or the clayers 110. After forming the clayers 110, the method 200 allows each LED die 102 to be picked up by a PPH 902 and moved to a display substrate 1002 (described below with reference to FIG. 10). The steps may be performed in different orders, and the method 200 may include different, additional, or fewer steps.

Figure 3:
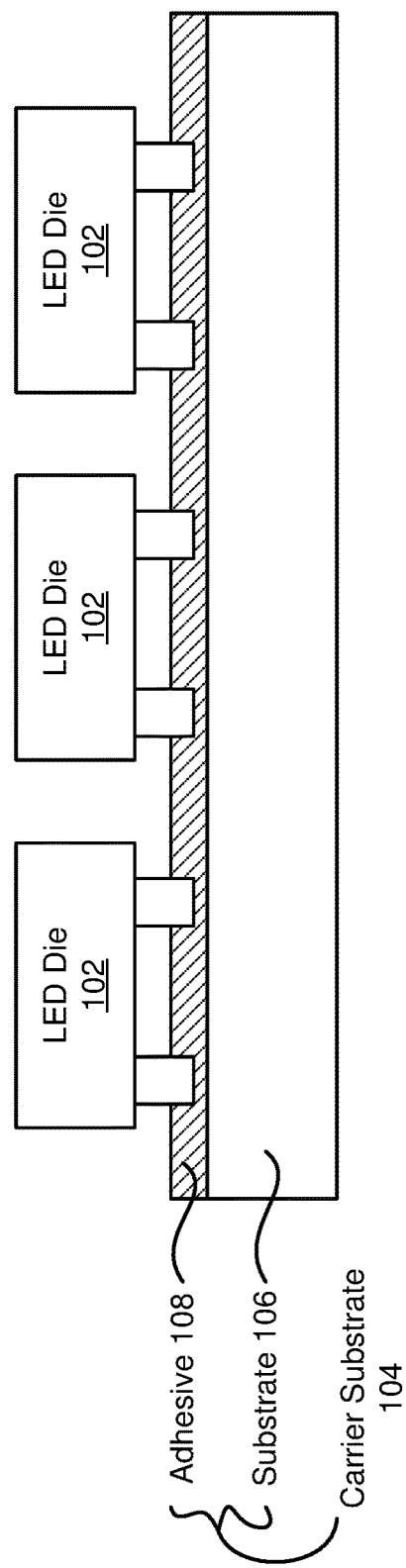
FIG. 3 is a cross sectional view of LED dies on the carrier substrate, according to one embodiment.

Conformable material 502 (as shown in FIG. 5A) is formed 202 in the regions between the LED dies 102 on the carrier substrate 104 and over the LED dies 102. In some embodiments, the conformable material 502 includes a polymer thermoset. In some embodiments, the conformable material includes an elastomeric material and a photoinitiator to facilitate curability of the elastomeric material under UV treatment. The elastomeric material may include a viscoelastic material such as PDMS, and a photosensitive materials such as a mix of benzophenone in xylene, or a material with both viscoelastic and photosensitive properties such as photoresists. The LED dies 102 on the carrier substrate 104 may be evenly spaced apart and mounted to the substrate 106 by a layer of adhesive 108 (as shown in FIG. 3). The conformable material 502 forms a conformable layer over the LED dies 102 to facilitate adhesive attachment with a pick-up head. The photosensitive material of the conformable material 502 includes physical properties that are altered by light to allow portions of the conformable material 502 to be dissolved or otherwise gently removed in a manner that does not damage other portions of the conformable material that remain over the LED dies 102 that form the conformable layers. For example, the conformable material 502 may include a light-sensitive material that causes the conformable material 502 to cure when exposed to light at specific wavelengths. The conformable material 502 may be insoluble in the cured state and soluble in the uncured state to a photosensitive material developer. The carrier substrate 104 may be an intermediate carrier substrate to facilitate LED die 102 transfer to the display substrate 1002. The space between the LED dies 102 may be a result of the singulation process (in which a single group of LED dies 102 are separated into individual LED dies 102) or another process that creates the open regions between the LED dies 102 (as described in the next paragraph, for example). In some embodiments, the conformable material 502 is mixed with a solvent, and formed between the LED dies 102 on the carrier substrate 104 and over the LED dies 102 by spin coating. The conformable material 502 may then be soft baked to minimize the solvent concentration.

In embodiments where the LED dies 102 are fabricated on a native substrate and then mounted to the carrier substrate 104, the regions between the LED dies 102 may be formed to a particular distance by the use of an expanding carrier film. The carrier film is attached to a first side of the LED dies 102 on the native substrate. The LED dies 102 may be singulated before or after the carrier film is attached to the LED dies 102. After the LED dies 102 are detached from the native substrate, the LED dies 102 may be separated by expanding the carrier film to widen the open regions between the LED dies 102. The carrier substrate 104 is applied to a second side of the LED dies 102, the LED dies 102 being attached to the adhesive 108 layer of the carrier substrate 104 with the open regions being defined between the LED dies 102. The carrier film may be separated from the first side of the LED dies 102 to expose the first die of the LED dies 102.

Figure 4:
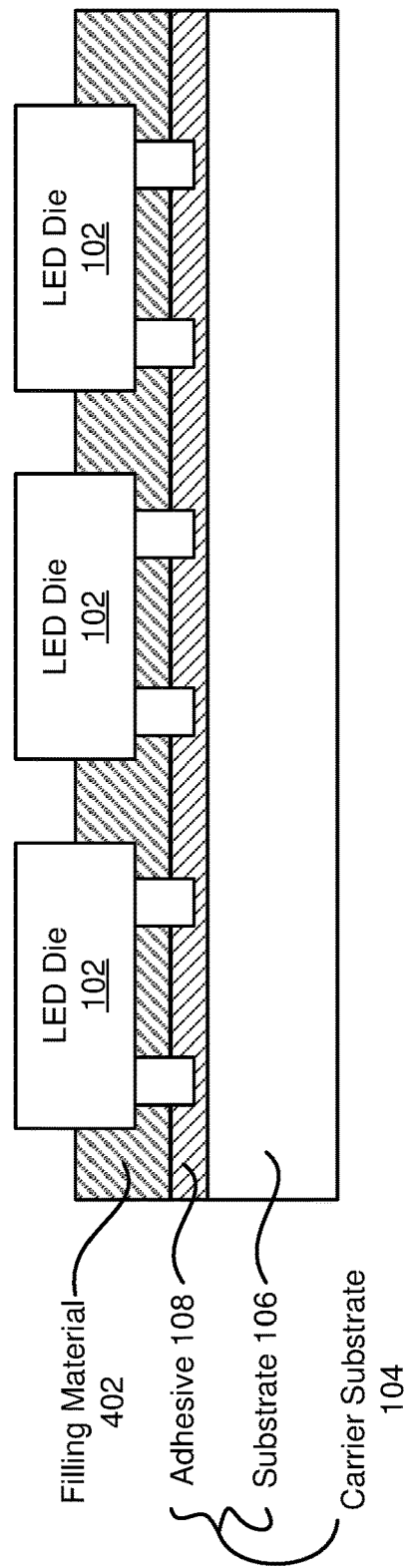
FIG. 4 is a cross sectional view of LED dies on the carrier substrate with filling material in regions between the LED dies, according to one embodiment.

In some embodiments, prior to forming the conformable material 502, a filling material 402 (as shown in FIG. 4) is formed in the regions between the LED dies. In these embodiments the conformable material 502 is formed on top of the filling material 402 (as shown in FIG. 5B). This may be done to prevent the conformable material 502 from contacting with the adhesive 108. A filling material 402 may also be used to reduce costs. For example, the filling material 402 may be less expensive than the conformable material 502, and allows less filling material to be discarded in the process of forming the clayer 110. In other examples, the filling material 402 may provide mechanical stability to the LED dies 102 or fix the LED dies 102 in place on the carrier substrate 104 during the clayer 110 fabrication process. In embodiments where the filling material 402 is used, the filling material may later be removed (e.g., with a solvent) such that both materials (the conformable material 502 and filling material 402) can be selectively removed.

Figure 6:
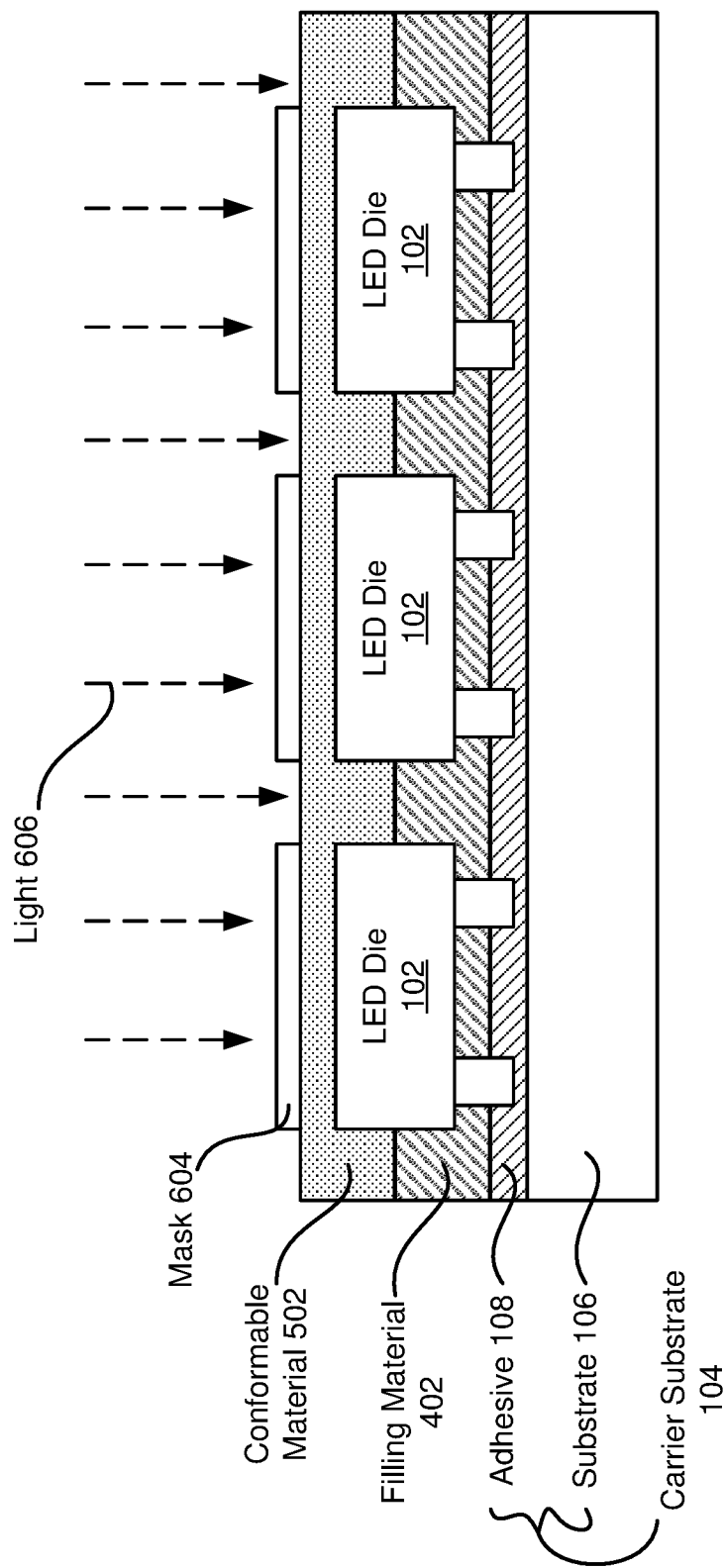
FIG. 6 is a cross sectional view of LED dies on the carrier substrate with a mask exposing regions of conformable material to light, according to one embodiment.

A mask 604 (as shown in FIG. 6) is applied 206 over the conformable material 502 to selectively cover the conformable layer. In some embodiments, the conformable material 502 includes a positive photosensitive material, and the mask 604 covers regions of the conformable material 502 over the LED dies 102 and exposes regions of the conformable material 502 between the LED dies 102. In other embodiments, the conformable material 502 includes a negative photosensitive material, and the mask 604 covers regions of the conformable material 502 between the LED dies 102 and exposes regions of the conformable material 502 over the LED dies 102. The mask 604 may be an opaque plate with holes or transparencies that allow light 606 to shine through in a defined pattern. In some embodiments the mask is laid on top of the conformable material 502. In other embodiments, the mask does not contact the conformable material 502. In some embodiments, the mask 604 is a photomask used in photolithography and is designed to block light from shining onto the covered regions of the conformable material 502.

Figure 7:
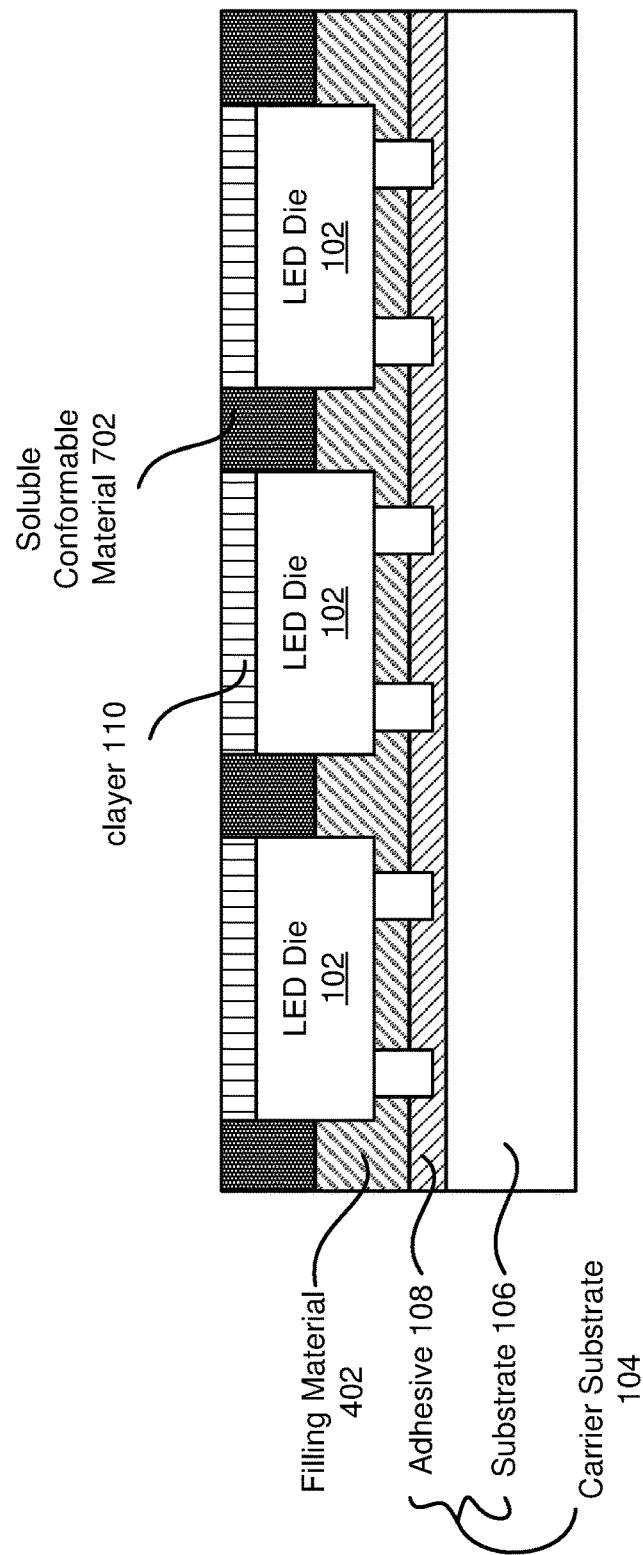
FIG. 7 is a cross sectional view of LED dies on the carrier substrate with regions of clayer and regions of soluble conformable material, according to one embodiment.

Using the mask 604, portions of the conformable material 502 are exposed 208 to light 606 to cure or not cure the portions of the conformable material 502. Light 606 is applied at the regions of the conformable material 502 exposed by the mask 604. In embodiments where the conformable material 502 includes the positive photosensitive material, the mask 604 exposes regions between the LED dies 102 such that the light 606 does not cure the conformable material 502 between the LED dies 102, and causes the conformable material 502 between the LED dies 102 to transition from insoluble to soluble. In these embodiments, the conformable material 502 over the LED dies 102 may be cured after the light 106 does not cure the conformable material 502 between the LED dies 102. For example, the conformable material 502 over the LED dies 102 may be cured by a baking process. In embodiments where the conformable material 502 includes a negative photosensitive material, the mask 604 exposes regions over the LED dies 102 such that the light 606 cures the conformable material 502 over the LED dies 102, and causes the conformable material 502 over the LED dies 102 to transition from soluble to insoluble. This results in regions of soluble conformable material 702 (as shown in FIG. 7) between the LED dies 102 that may be removed (e.g., with a photosensitive material developer or other technique) and a clayer 110 over each LED die 102. In some embodiments the light 606 is collimated ultraviolet (UV) light.

The soluble conformable material 702 between the LED dies 102 is removed 210 to form a clayer over each of the LED dies 102 (as shown in FIG. 1). As such, the regions of the conformable material 502 over the LED dies 102 are preserved (e.g., as a result of being insoluble). As discussed above, the soluble conformable material 702 between the LED dies 102 is not cured, and thus may be removed with a photosensitive material developer. The photosensitive material developer is a substance that dissolves soluble conformable material 702 while being benign to the insoluble conformable 504 over the LED dies 102.

Figure 8:
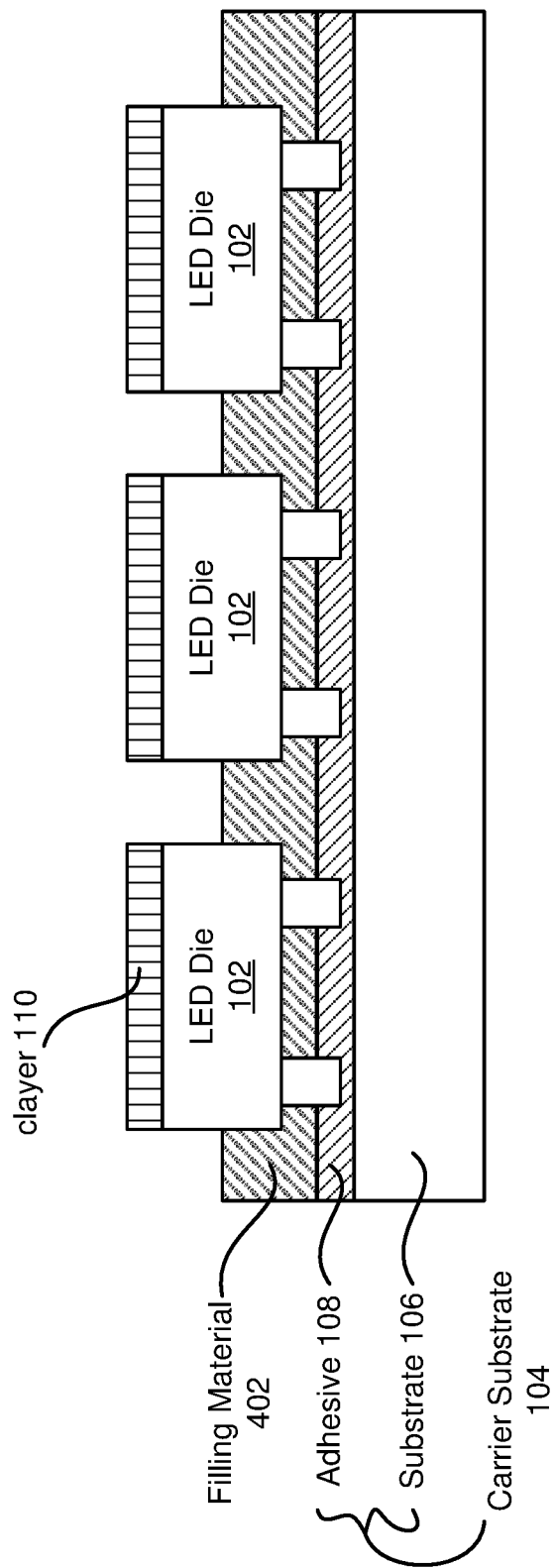
FIG. 8 is a cross sectional view of LED dies on the carrier substrate with regions of conformable material removed, according to one embodiment.

In embodiments where a filling material 402 is formed before the conformable material 502, the filling material 402 between the LED dies 102 (as shown in FIG. 8) is removed after the soluble conformable material 702 between the LED dies 102 is removed. This similarly results in a clayer over each of the LED dies (as shown in FIG. 1). In some embodiments, the filling material 402 is removed with a solvent. The solvent removes the filling material 402 while being benign to the clayer 110. The solvent may be applied on the filling material 402 to remove the filling material 402 in the open regions between the LED dies 102. For example, the filling material 402 can be removed by water if the filling material 402 includes polyvinyl alcohol (PVA). In another example, the filling material 402 can be removed by acetone if the filling material 402 includes polyvinyl butyral (PVB). In another example, the filling material 402 may be removed by etching, such as dry etching.

FIG. 3 is a cross sectional view of LED dies 102 on the carrier substrate 104, according to one embodiment. The carrier substrate 104 may be an intermediate carrier substrate to facilitate LED die 102 transfer between a native substrate and a display substrate. Each LED die 102 does not have a clayer 110 over it. As a result, a pick-up surface 904 of a PPH 902 is not capable of removing the LED dies 102 from the carrier substrate 104.

FIG. 4 is a cross sectional view of LED dies 102 on the carrier substrate 104 with filling material 402 in the regions between the LED dies 102, according to one embodiment. In some embodiments the filling material is applied to the regions between the LED dies 102 before the conformable material 502 is applied to the regions between the LED dies 102 and over the LED dies 102. The filling material 402 may also fill regions under the LED dies 102. In some embodiments the filling material 402 is be cured before the conformable material 502 is applied. In some embodiments the filling material is removed from the carrier substrate 104 with a solvent. In some embodiments, the filling material 402 is not applied to completely fill the regions between the LED dies 102. In some embodiments, the filling material 402 is not applied over the LED dies 102 as this may hinder the conformable material 502 from covering the top of the LED dies 102. In alternative embodiments, after applying the filling material 402, excess filling material 402 over the LED dies 102 is removed before the conformable material 502 is applied.

FIG. 5A is a cross sectional view of LED dies 102 on the carrier substrate 104 with material in the regions between the LED dies 102 and over the LED dies 102, according to one embodiment. In FIG. 5A, the conformable material 502 is applied so that it covers the top of each LED die 102 and fills the open space between the LED dies 102. The conformable material 502 may also fill regions under the LED dies 102. In embodiments where a filling material 402 is applied (as shown in FIG. 5B), the conformable material 502 only partially fills the space between the LED dies 102.

FIG. 6 is a cross sectional view of LED dies 102 on the carrier substrate 104 with a mask 604 exposing regions of conformable material 502 to light 606, according to one embodiment. The conformable material 502 may include photosensitive material so that the conformable material 502 becomes cured or does not cure if exposed to light (rendering the conformable material 502 insoluble or soluble, respectively), allowing portions of the conformable material 502 to be removed. FIG. 6 also includes a mask 604 and light 606 applied towards the LED dies 102. The mask 604 covers portions of the conformable material 502 so that the light 606 only shines on select regions of the conformable material 502. In some embodiments, the conformable material 502 includes a positive photosensitive material, and the mask 604 covers regions of the conformable material 502 over the LED dies 102. In other embodiments, the conformable material 502 includes a negative photosensitive material, and the mask 604 covers regions of the conformable material 502 between the LED dies 102. In some embodiments, the light 606 is applied at a specific wavelength range. For example, the light 606 has UV wavelengths that cure or do not cure the conformable material 502, depending on whether the photosensitive material is positive or negative.

FIG. 7 is a cross sectional view of LED dies 102 on the carrier substrate 104 with regions of clayer 110 and regions of soluble conformable material 702. In embodiments where the conformable material 502 includes positive photosensitive material, the light 606 does not cure the conformable material 502 between the LED dies 102 so that the conformable material 702 is soluble. For example, the applied light 606 does not cure the conformable material 502 between the LED dies 102 such that it can be dissolved with a photosensitive material developer. In embodiments where the conformable material 502 includes negative photosensitive material, the light 606 cures the conformable material 502 over the LED dies 102 without curing the conformable material 502 between the LED dies 102 such that the conformable material 502 between the LED dies 102 remains soluble. For example, the applied light 606 cures the conformable material 502 over the LED dies 102 such that it is insoluble and is not dissolved by the photosensitive material developer. As such, the conformable material 502 between the LED dies 102 is or is transitioned into a soluble conformable material 702 that can be removed, for example by dissolving in a photosensitive material developer or other technique.

FIG. 8 is a cross sectional view of LED dies 102 on the carrier substrate 104 with regions of soluble conformable material 702 removed, according to one embodiment. When a filling material 402 is used, the filling material 402 may be removed after the soluble conformable material 702 is removed, such as by dissolving in a solvent or some other suitable technique that does not damage the clayer 110. In some embodiments, the filling material 420 is dissolved by the same solvent as the soluble conformable material 702.

Figure 9:
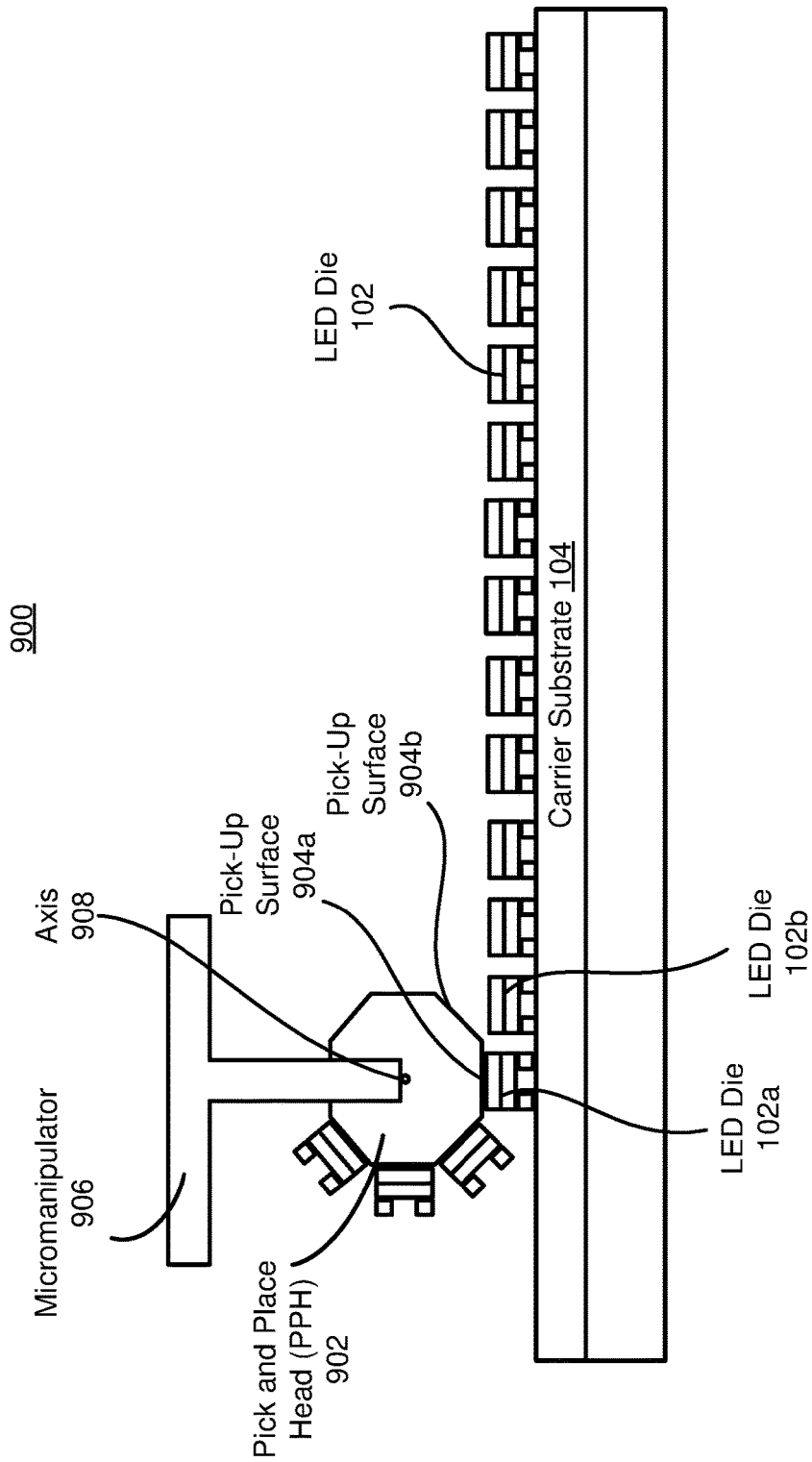
FIG. 9 is a display manufacturing system during pick up of the LED dies from a carrier substrate, according to one embodiment.

FIG. 9 is a display manufacturing system 900 during pick up of the LED dies 102 from a carrier substrate 104, according to one embodiment. The system 900 includes a PPH 902 for picking LED dies 102 from the carrier substrate 104. The PPH 902 is an example of a pick-up head that can be used to adhere with a clayer 110 of an LED die 102, although other types of pick-up heads may also be used. The system 900 includes the LED dies 102, the carrier substrate 104, a micromanipulator 906, a PPH 902 defining an axis 908, and pick-up surfaces 904. The LED dies 102 are mounted to the carrier substrate 104. The micromanipulator 906 moves the PPH 902, such as with 6 degrees of freedom. The PPH 902 includes pick-up surfaces 904 that adheres with the clayers 110 of the LED dies 102 for pick and place operations.

The micromanipulator 906 is connected to the PPH 902 and controls movement of the PPH 902. The micromanipulator 906 aligns the PPH 902 with the carrier substrate 104 to allow the PPH 902 to pick up one or more LED dies 102. In some embodiments, the micromanipulator 906 may be a multiple degree of freedom micromanipulator, such as a four degree of freedom micromanipulator configured to move the PPH 902 up and down, left and right, forward and back, or rotate the PPH 902 (e.g., along the rotational axis 908). In some embodiments, the system 900 includes multiple micromanipulators 906 and/or PPHs 902 perform pick and place tasks in parallel to increase throughput of the system.

The PPH 902 has a polygon shaped cross section. The edges of the polygon shape cross section define multiple pick-up surfaces 904 of the PPH 902. The clayer 110 of each LED dies 102 are configured to mount to the pick-up surfaces 904 (e.g., due to adhesion forces) to facilitate transfer of the LED dies 102 from the carrier substrate 104 to a display substrate 1402. The PPH 902 may be rotated along the rotational axis 908 to pick up arrays of LED dies 102 at one or more pick-up surfaces 904. Although the PPH 902 has an octagonal cross section and eight pick-up surfaces 904, a PPH 902 may have different shaped cross sections (e.g., triangular, square, hexagon, etc.) and different numbers of pick-up surfaces in various embodiments. Although the pick and place tool discussed herein is a PPH 902, other types of pick-up heads using adhesive attachment with clayers 110 may be used.

The pick-up surfaces 904 may be non-conformable pick-up heads that allow the LED dies 102 with clayers 110 to attach to the PPH 902. For example, the pick-up surfaces 904 may be glass or fused silica. The pick-up surfaces 904 interface with the clayer 110 of the LED dies 102 using adhesion forces, such as Van der Waals. The adhesive 108 may be removed from the carrier substrate 104 before the pick-up surfaces 904 attach to the clayer 110 of each LED die 102. Although the clayers 110 discussed herein are particularly adapted for non-comforable pick-up heads, in some embodiments, the pick-up surfaces 904 are conformable, such as with an elastomeric coating.

Subsequent to the PPH 902 picking up the one or more first LED dies 102a with the first pick-up surface 904a, the PPH 902 is rotated about axis 908 to pick up one or more second LED dies 102b with a second pick-up surface 904b of the PPH 902. The second pick-up surface 904b may be adjacent to the first pick-up surface 904a, as shown in FIG. 9, or may be a non-adjacent pick-up surface 904 to the first pick-up surface 904a.

Figure 10:
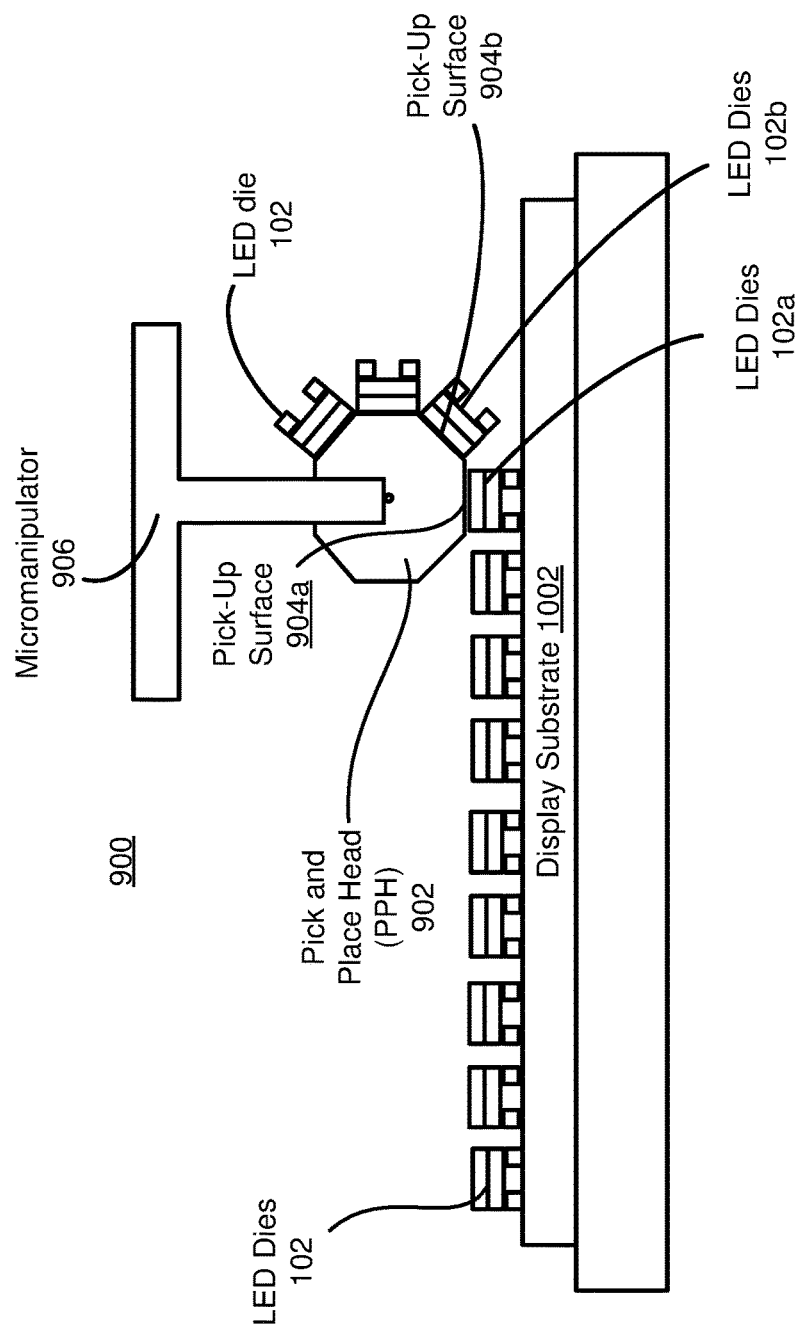
FIG. 10 is a cross sectional view of the display manufacturing system during LED die placement on a display substrate, according to one embodiment.

FIG. 10 is a cross sectional view of the display manufacturing system 900 during LED die 102 placement on a display substrate 1002, according to one embodiment. The LED dies 102 attached to the PPH 902 via the clayers 110 are placed on the display substrate 1002 of an electronic display.

After the PPH 902 has been populated with LED dies 102, the PPH 902 is moved away from the carrier substrate 104 and aligned with the display substrate 1002. For example, the PPH 902 may be lifted away from the carrier substrate 104 by the micromanipulator 906 for subsequent placement of the LED dies 102 on the display substrate 1002. The micromanipulator 906 places the LED dies 102 on the display substrate 1002 by aligning the PPH 902 with the display substrate 1002 and rolling the PPH 902 across the display substrate 1002. The display substrate 1002 may be part of an electronic display with the LED dies 102 placed at sub-pixel locations to connect with the control circuits in the display substrate 1002 that drive the LED dies 102. For example, the display substrate 1002 may be a printed circuit board including gate lines and data lines for a control circuit at each sub-pixel that drive the LED dies 102 according to signals on the gate and data lines. After placement, the LED dies 102 may be bonded to the display substrate 1002, such as using thermocompression (TC) bonding.

Figure 11:
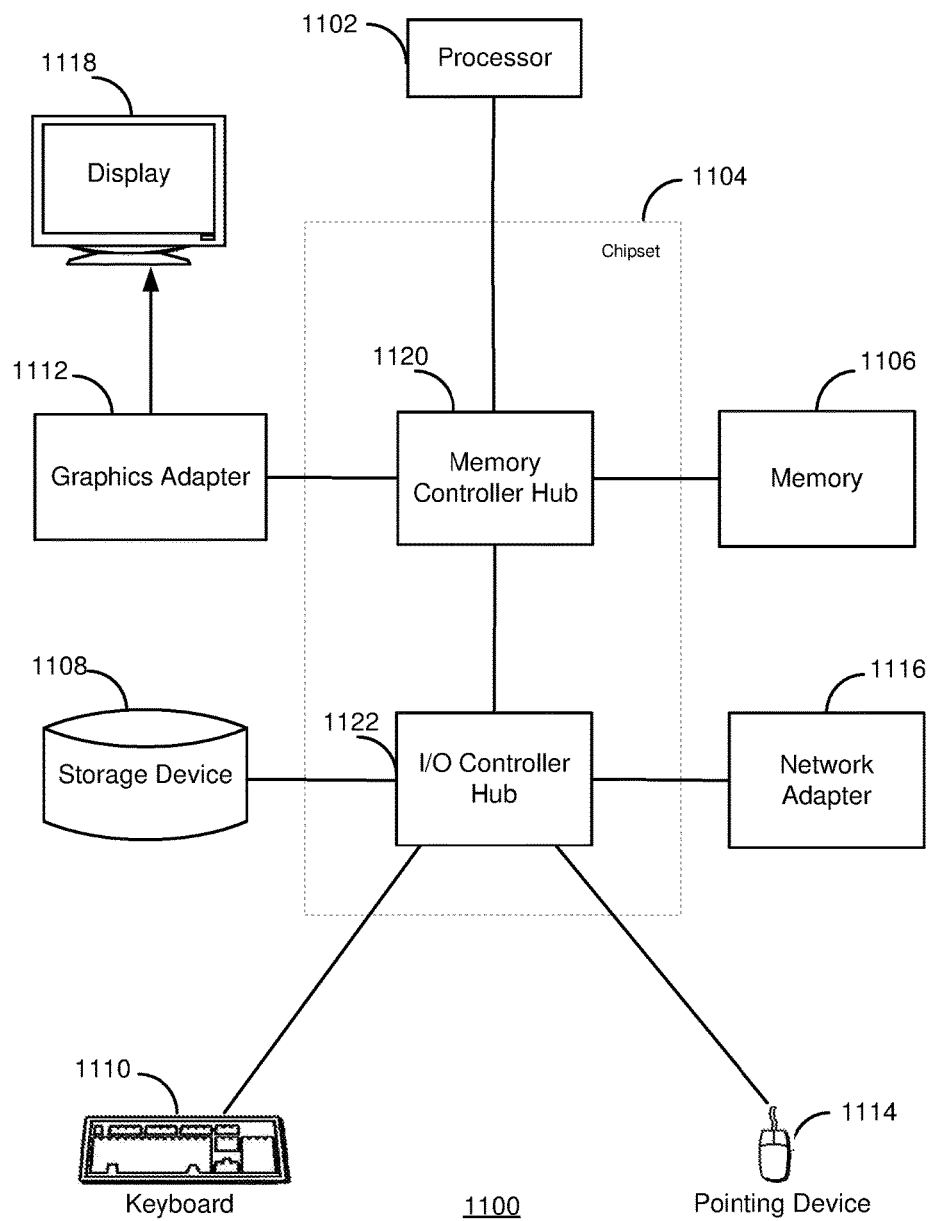
FIG. 11 is a block diagram illustrating a computer system for use in the display manufacturing system, according to one embodiment.

FIG. 11 is a high-level block diagram illustrating an example of a computer system 1100 for use in the display manufacturing system 900 shown above, according to one embodiment. The computer system 1100 may be used to control the manufacturing processes discussed herein. For example, the method 200 shown in FIG. 2 may be performed under the control of the computing system 1100. Illustrated in FIG. 11 are at least one processor 1102 coupled to a chipset 1104. The chipset 1104 includes a memory controller hub 1120 and an input/output (I/O) controller hub 1122. A memory 1106 and a graphics adapter 1112 are coupled to the memory controller hub 1120, and a display device 1118 is coupled to the graphics adapter 1112. A storage device 1108, keyboard 1110, pointing device 1114, and network adapter 1116 are coupled to the I/O controller hub 1122. Other embodiments of the computer 1100 have different architectures. For example, the memory 1106 is directly coupled to the processor 1102 in some embodiments.

The storage device 1108 includes one or more non-transitory computer-readable storage media such as a hard drive, compact disk read-only memory (CD-ROM), DVD, or a solid-state memory device. The memory 1106 holds instructions and data used by the processor 1102. For example, the memory 1106 may store instructions that when executed by the processor 1102, configures the processor to perform the method 200. The pointing device 1114 is used in combination with the keyboard 1110 to input data into the computer system 1100. The graphics adapter 1112 displays images and other information on the display device 1118. In some embodiments, the display device 1118 includes a touch screen capability for receiving user input and selections. The network adapter 1116 couples the computer system 1100 to a network. Some embodiments of the computer 1100 have different and/or other components than those shown in FIG. 11.

The computer 1100 is adapted to execute computer program modules for providing functionality described herein. As used herein, the term "module" refers to computer program instructions and/or other logic used to provide the specified functionality. Thus, a module can be implemented in hardware, firmware, and/or software. In one embodiment, program modules formed of executable computer program instructions are stored on the storage device 1108, loaded into the memory 1106, and executed by the processor 1102. For example, program instructions for the method describe herein can be stored on the storage device 1108, loaded into the memory 1106, and executed by the processor 1102.

The foregoing description of the embodiments has been presented for the purpose of illustration; it is not intended to be exhaustive or to limit the patent rights to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A method, comprising:
   forming a conformable material at side surfaces and over a light emitting surface of an LED die on a carrier substrate;
   applying a mask over the conformable material to selectively cover the conformable material;
   exposing portions of the conformable material to light to selectively cure the conformable material over the light emitting surface of the LED die; and
   removing the conformable material at the side surfaces that is not cured after exposing the portions of the conformable material to light to form a conformable interface layer over the light emitting surface of the LED die from the conformable material over the LED die.

2. The method of claim 1, further comprising:
prior to forming the conformable material at the side surfaces and over the light emitting surface of the LED die, forming a filling material at the side surfaces of the LED die, the conformable material at the side surfaces being formed over the filling material and the LED die; and
subsequent to removing the conformable material at the side surfaces, removing the filling material at the side surfaces of the LED die.

3. The method of claim 1, further comprising:
picking up the LED die on the carrier substrate by attaching a non-conformable pick-up head to the conformable interface layer over the light emitting surface of the LED die;
placing the LED die attached to the non-conformable pick-up head on a display substrate defining pixel control circuits of an electronic display.

4. The method of claim 1, wherein the conformable material includes positive photosensitive material and the portions of the conformable material exposed to the light includes the conformable material at the side surfaces of the LED die such that the light does not cure the conformable material at the side surfaces of the LED die.

5. The method of claim 1, wherein the applied light includes ultraviolet wavelengths.

6. The method of claim 1, wherein the LED die is a micro-LED and includes Gallium nitride (GaN), gallium arsenide (GaAs), or gallium phosphide (GaP).

7. The method of claim 1, wherein the conformable material includes negative photosensitive material and the portion of the conformable material exposed to the light includes the conformable material over the LED die such that the light cures the conformable material over the LED die.

8. The method of claim 1, wherein a plurality of LED dies are present on the carrier substrate, the conformable material is formed in regions between the LED dies and over the LED dies, the mask is applied over the plurality of LED dies, and the conformable material between the LED dies is removed to form a conformable interface layer over each of the LED dies from the conformable material over the LED dies.

9. The method of claim 8, further comprising:
fabricating the LED dies on a native substrate;
attaching a carrier film capable of expanding to a first side of the LED dies on the native substrate;
detaching the native substrate from the LED dies;
singulating the LED dies attached to the carrier film;
separating the LED dies by expanding the carrier film to define the regions between the LED dies;
applying the carrier substrate to a second side of the LED dies, the carrier substrate including a glass substrate layer and an adhesive layer, the LED dies being attached to the adhesive layer of the carrier substrate with the regions being defined between the LED dies; and
separating the carrier film from the first side of the LED dies to expose the first side of the LED dies to the forming of the conformable material.

10. An electronic display panel fabricated by a method, comprising:
forming a conformable material in regions between LED dies on a carrier substrate and over the LED dies;
applying a mask over the conformable material to selectively cover the conformable material;
exposing portions of the conformable material to light to selectively cure the portions of the conformable material over the LED dies;
removing the conformable material between the LED dies that is not cured after exposing the portions of the conformable material to light to form a conformable interface layer over each of the LED dies from the conformable material over the LED dies
picking up at least a portion of the LED dies on the carrier substrate by attaching a pick-up head to the conformable interface layers over the LED dies; and
placing the at least a portion of the LED dies attached to the pick-up head on a display substrate defining pixel control circuits of an electronic display panel.

11. The electronic display panel of claim 10, wherein the conformable material includes positive photosensitive material and the portions of the conformable material exposed to the light includes the conformable material between the LED dies such that the light does not cure the conformable material between the LED dies.

12. The electronic display panel of claim 10, wherein the conformable material includes negative photosensitive material and the portions of the conformable material exposed to the light includes the conformable material over the LED dies such that the light cures the conformable material over the LED dies.

13. The electronic display panel of claim 10, wherein the LED dies are micro-LEDs and include Gallium nitride (GaN), gallium arsenide (GaAs), or gallium phosphide (GaP).

14. The electronic display panel of claim 10, further comprising:
forming a filling material in regions between light emitting diode (LED) dies on a carrier substrate;
removing the filling material in the regions between the LED dies.

15. A non-transitory computer readable medium storing instructions that when executed by a processor of a display manufacturing system configure the display manufacturing system to:
form a conformable material at side surfaces and over a light emitting surface of an LED die on a carrier substrate;
apply a mask over the conformable material to selectively cover the conformable material;
expose portions of the conformable material to light to selectively cure the conformable material over the light emitting surface of the LED die; and
remove the conformable material at the side surfaces that is not cured after exposing the portions of the conformable material to light to form a conformable interface layer over the light emitting surface of the LED die from the conformable material over the LED die.

16. The computer readable medium of claim 15, wherein the instructions further configure the processor to:
prior to forming the conformable material at the side surfaces and over the light emitting surface of the LED die, form a filling material at the side surfaces of the LED die, the conformable material at the side surfaces being formed over the filling material and the LED die; and
subsequent to removing the conformable material at the side surfaces, remove the filling material at the side surfaces of the LED die.

17. The computer readable medium of claim 15, wherein the instructions further configure the processor to:
  pick up the LED die on the carrier substrate by attaching a non-conformable pick-up head to the conformable interface layer over the light emitting surface of the LED die; and
  place the LED die attached to the non-conformable pick-up head on a display substrate defining pixel control circuits of an electronic display.

18. The computer readable medium of claim 15, wherein the conformable material includes positive photosensitive material and the portions of the conformable material exposed to the light includes the conformable material at the side surfaces of the LED die such that the light does not cure the conformable material at the side surfaces of the LED die.

19. The computer readable medium of claim 15, wherein the conformable material includes negative photosensitive material and the portion of the conformable material exposed to the light includes the conformable material over the LED die such that the light cures the conformable material over the LED die.

\* \* \* \* \*